United States Patent [19]
Saida et al.

[11] Patent Number: 5,545,466
[45] Date of Patent: Aug. 13, 1996

[54] COPPER-CLAD LAMINATE AND PRINTED WIRING BOARD

[75] Inventors: Muneo Saida, Tokyo; Yutaka Hirasawa, Okegawa; Katsuhiro Yoshimura, Oomiya, all of Japan

[73] Assignee: Mitsui Mining & Smelting Co., Ltd., Nihombashi-Muromachi, Japan

[21] Appl. No.: 500,540

[22] Filed: Jul. 11, 1995

Related U.S. Application Data

[63] Continuation-in-part of Ser. No. 143,849, Oct. 26, 1993, Pat. No. 5,437,914.

[30] Foreign Application Priority Data

Mar. 19, 1993 [JP] Japan ................................ 5-85765

[51] Int. Cl.$^6$ ....................................................... B32B 9/00
[52] U.S. Cl. ........................... 428/209; 428/343; 428/344; 428/901; 216/20; 156/233
[58] Field of Search .................................... 428/209, 343, 428/344, 901; 216/20; 156/233

*Primary Examiner*—Patrick J. Ryan
*Assistant Examiner*—Cathy K. Lee
*Attorney, Agent, or Firm*—Bucknam and Archer

[57] ABSTRACT

The present invention provides a copper-clad laminate characterized in that an electrolytic copper foil on the glossy (shiny) surface side of which a copper electrodeposit is formed, is bonded at its glossy surface side to one side or each of both sides of a substrate, which has a fine-pitch wiring (circuit) pattern and exhibits a high etching factor. The present invention further provides a copper-clad laminate which can be suitably employed in the production of such a printed wiring board.

4 Claims, 3 Drawing Sheets

COPPER-CLAD LAMINATE AND PRINTED WIRING BOARD

CROSS-REFERENCE TO RELATED APPLICATIONS

This is a Continuation-in-Part of U.S. Ser. No. 08/143,849, now U.S. Pat. No. 5,437,914 filed Oct. 26, 1993.

BACKGROUND OF THE INVENTION

1. Field of the Invention

The present invention relates to a copper-clad laminate and a printed wiring board. More particularly, the present invention relates to a printed wiring board having a fine-pitch wiring pattern and exhibiting a high etching factor, and further relates to a copper-clad laminate which can be suitably employed in the production of such a printed wiring board.

2. Prior Art

The copper-clad laminate used in the production of a printed wiring board is usually obtained by bonding a copper foil as a conductive layer to one side or both sides of a substrate made from a glass-reinforced epoxy resin material or the like. A wiring pattern is formed by etching the copper foil. The copper foil and the substrate are bonded together under pressure while heating with or without an adhesive interposed therebetween.

Electrolytically produced copper foil is generally employed. The electrolytic copper foil is obtained by electroplating a copper foil on a metal drum. One side (the glossy or shiny surface) of the electrolytic copper foil is relatively smooth, while the other side (the matte surface) is generally rough. When viewed in cross-section, the texture on the glossy surface, which is formed next to the drum during the initial stage of electrodeposition, exhibits random orientation of small crystal grains. As electrodeposition proceeds away from the drum toward the outer or matte surface, the crystal grains become oriented in the direction of the electrodeposition and become larger.

In the conventional electrolytic copper-clad laminates, the electrolytic copper foil is bonded on its matte surface side to the substrate for the reasons of greater bonding strength and easier handling. The circuit pattern is formed by applying a resist pattern and then etching from the exposed glossy (shiny) surface down to the substrate. In order to improve the peel strength from the substrate, copper particles of 0.2 to 3.5 μm diameter are applied to the matte surface of the copper foil.

Although the circuit lines should have vertical sides defined by the resist pattern, formation of a wiring pattern by etching the above-mentioned copper-clad laminate produces circuit lines having sides which are not perfectly vertical, due to the effects of crystal orientation and crystal grain boundaries on etching. Sharp edges of the conductor pattern cannot be obtained. The accuracy of the circuit lines may be defined by the "etching factor", as is shown in FIG. 1. When the etching factor is small, the top of a circuit line is narrow and the bottom is broad due to horizontal etching in addition to the desired vertical etching. Thus, the spacing (gap) between the conductor lines in a circuit pattern is reduced, thereby causing a problem that migration is likely to occur. Thus, since the circuit lines are not perfectly rectangular, formation of fine patterns is difficult. In commercial practice, the etching factor should be as large as possible, preferably above about 4.

Decreasing the thickness of the copper foil is one means of obtaining a fine pattern. In this case, the cross-sectional area of the conductor becomes so small that the quantity of available electric current is small. Accordingly, to allow ample current passage, it is necessary to increase the cross-sectional area of the conductor by copper plating the wiring pattern obtained by the etching. Also, when the copper layer is thin, lead bending occurs in a film carrier having an inner lead, e.g., TAB.

Moreover, in the etching of the above-mentioned conventional copper-clad laminate for fine pattern formation, electrodeposited copper particles remain adherent to the substrate of the printed wiring board at the bottom of the conductor pattern formed by etching, and the remaining electrodeposited copper particles cause the insulating resistance between the conductors to decrease, in extreme cases causing short-circuiting.

Various reports have been published describing the formation of copper electrodeposits on the copper foil. For example, the electrodeposition of a layer of copper particles onto both sides of a copper foil has been reported. However, this copper foil is used as an inner conductor layer in a multilayer printed wiring board and the purpose of the electrodeposition is to provide a substitute for the black oxide treatment aiming at ensuring the adhesion of the inner copper foil to the substrate at the secondary bonding. A pattern printing is applied to the glossy surface side.

In another example, Japanese Patent Application Laid-Open Gazette No. 29740/1993 describes an electrolytic copper foil having both sides thereof provided with gloss plating, with one of the sides of the copper foil having been subjected to surface treatment, such as roughening. In this example also, the etching is performed from the glossy surface side.

The lamination of the glossy side of an electrolytic copper foil to a substrate has been disclosed, but the effect of this on the etching process has not been recognized. For example, Adler in U.S. Pat. No. 4,997,516 discusses the need to deposit a roughening layer on the shiny ("glossy") side of the foil in order to provide adhesion to the substrate. However, he notes that this is not commonly done. Adler further comments on the difficulties experienced with foils which have roughening deposits on both the shiny and matte sides. In WO 94/21097, Polyclad Laminates advocates bonding the shiny side of a foil to the substrate in order to obtain advantages in the manufacture of multi-layer circuit boards. Neither of these disclosures suggests that improved etching could result, perhaps because neither recognized that the degree of roughness on the matte side is an important factor in achieving circuit lines having a high etching factor.

As suggested above, the copper grain size at and near the glossy surface is small and the grains are randomly shaped. Consequently, acid used for etching circuit lines can travel along the grains boundaries horizontally as well as in the desired vertical direction. As result the top of the circuit lines generally will be narrower than the bottom when etching is carried out from the glossy side. The copper grains at the matte surface are generally columnar or planar in shape and extend vertically into the copper foil. Therefore, etching from the matte side minimizes the horizontal etching ordinarily observed when etching from the glossy side and improves the etching factor. However, the degree of roughness on the matte side of the foil is an important factor and should be within certain limits, as will be seen from the description of the invention below.

SUMMARY OF THE INVENTION

The present invention overcomes the above problems of the prior art. It is an object of the present invention to provide a printed wiring board which exhibits a high etching factor, preferably at least 4, while maintaining adequate peel strength and which is free from copper particles at the base of the wiring pattern, and thereby provides a wiring pattern of fine pitch.

The above object can be attained by forming a granular copper electrodeposit to increase roughness on a glossy surface side of an electrolytic copper foil and then bonding the copper foil on the glossy surface side to a substrate. The roughness of the matte side of the foil is about 2 to 7.5 µm as made in order to provide a suitable grain structure for accurate etching of the circuit lines as well as to improve resist definition. Also, the inherent roughness of the matte surface makes it easier to avoid subsequent chemical treatments, such as black oxide, usually needed on the glossy side when making multilayer circuit boards. However, if the matte side roughness is greater, it is more likely that the resist will lock-in to the foil and be difficult to remove after the circuit pattern has been etched.

Thus, according to the present invention there is provided a copper-clad laminate characterized in that an electrolytic copper foil having a glossy surface on one side and a matte surface on the other side, in which a copper deposit is formed on the glossy surface side, is bonded at its glossy surface side to one side or each of both sides of a substrate. Further, the invention includes a printed wiring board produced by using the above described copper-clad laminate.

Hereinbelow, the copper-clad laminate and the printed wiring board according to the present invention will be described in more detail.

FIGS. 2(a) through (c) illustrate the steps of a process for producing the copper-clad laminate of the present invention. As shown in FIG. 2(a), a copper electrodeposit 2 is formed on a glossy surface side 1(a) of an electrolytic copper foil 1. The height of the copper electrodeposit is desirably in the range of from 0.2 to 2.0 µm. The copper electrodeposit 2 may assume various forms, such as whiskers, dendrites and nodular forms.

The copper electrodeposit 2 may be formed by electroplating at a high current density at room temperature. As a plating bath for use in such electroplating there may be mentioned a copper sulfate bath containing 10 to 30 g/L of copper and 50 to 150 g/L of sulfuric acid. Further, a copper plating (not shown) is applied onto the copper electrodeposit 2 under conditions such that the copper concentration is in the range of from 50 to 80 g/L, the sulfuric acid concentration is in the range of from 50 to 150 g/L and the bath temperature is in the range of from 40° to 50° C. in order to improve the adhesion of the copper electrodeposit to the copper foil. Still further, an appropriate treatment for corrosion prevention may be carried out.

Subsequently, the copper foil 1 cut to an appropriate width and then bonded to a substrate 3 on the glossy surface side 1(a) having the copper electrodeposit 2 formed thereon and further having been subjected to copper plating as shown in FIG. 2(b). The substrate 3 is not particularly limited. However, it is generally selected from among a substrate of a glass-reinforced epoxy resin, a substrate of a paper-filled phenol resin, a substrate of a polymer resin and a substrate of a polyester resin. The copper foil 1 is bonded to the substrate 3 directly or through an adhesive by pressing at an elevated temperature. Suitable as such an adhesive is, for example, a thermosetting epoxy resin adhesive.

Thus, a copper-clad laminate comprising a substrate 3 and, an electrolytic copper foil 1 laminated thereto is obtained. The electrolytic copper foil 1 has its matte surface 1(b) exposed. Although the matte surface roughness may be up to about 7.5 µm, when the matte surface 1(b) has a surface roughness (Rz) below 4 µm, resist is more uniformly applied to the matte surface 1(b), and thereby more accurate etching is achieved. (Excessive roughness may result in lock-in of the resist, making it difficult to remove after the circuit pattern has been etched.) Therefore, as shown in FIG. 2(c), the matte surface 1(b) may be smoothed by chemical polishing, such as etching, or by physical polishing, such as buffing. In the chemical polishing, for example an etching solution is employed which comprises cupric chloride, hydrochloric acid and hydrogen peroxide water.

From this copper-clad laminate, a printed wiring board having a fine-pitch wiring pattern is produced by applying a resist to the smoothed exposed surface (matte surface) of the electrolytic copper foil and forming a wiring pattern with a pitch of as fine as 150 µm or less by conventional procedures comprising light exposure, development and etching according to photolithography.

The printed wiring board made according to the invention exhibits a high etching factor, preferably at least 4, and is free from copper particles at the base of the circuit pattern on the substrate formed by etching.

In the copper-clad laminate of the present invention the electrolytic copper foil is bonded on its glossy surface side to the substrate. The glossy surface side of the copper foil has a random orientation of small crystal grains, while the matte surface side of the copper foil has large crystals oriented in the direction of the electrodeposition. Such foils will have a surface roughness Rz of about 2 to 7.5 µm on the matte side as made. Hence, when the etching is performed from the matte surface side, the etching proceeds along the grain boundaries, so that the crystals having large grain size and exhibiting high orientation in the side of the matte surface have less horizontal etching while the glossy surface side (substrate side) having small grain size and exhibiting random orientation is susceptible to side (horizontal) etching. Therefore, the use of such a copper-clad laminate leads to the production of a printed wiring board exhibiting a high etching factor (e.g., has less horizontal etching) and having a sharply etched fine-pitch wiring pattern. Further, according to the present invention, the density of the wiring pattern can be increased because the pattern can be designed so as to allow lines to have a larger width and a larger height even with the same pitch.

As illustrated above, the present invention has the following effects:

(1) a copper-clad laminate excellent in etching properties which ensures a large etching factor value is obtained and which finds wide applications in fields where fine pitch electric circuits are required;

(2) any wiring pitch as designed is obtained, thus making impedance control of the substrate possible;

(3) a high-density wiring is easily obtainable, whereby the productivity of a fine pitch printed wiring board is improved; and (4) a fine pitch wiring pattern can be formed from an electrolytic copper foil having a thickness greater than that in the prior art, so that an additional step for plating on the formed wiring pattern to meet a desired current passage is no longer needed.

PREFERRED EMBODIMENTS OF THE INVENTION

Hereinbelow, the present invention will be described in more detail with reference to the following Examples.

EXAMPLE 1

A granular copper layer was formed by plating on the glossy surface side of an electrolytic copper foil of 35 μm thickness having surface roughness (Rz) of 1.2 μm on the glossy side and a surface roughness (Rz) of 2.3 μm on the matte side. As a result, the roughness (Rz) of the glossy surface side of the copper foil became 2.7 μm.

The granular copper layer comprised a burnt (nodular) deposit produced by plating in a sulfuric acid bath having a copper concentration of 12 g/L and a sulfuric acid concentration of 100 g/L at a current density of 30 A/dm$^2$ for 10 seconds followed by cover plating in a sulfuric acid bath having a copper concentration of 60 g/L and a sulfuric acid concentration of 100 g/L at a current density of 30 A/dm$^2$ for 10 seconds.

The resultant electrolytic copper foil was subjected on both sides to the following treatment for corrosion prevention. The treatment for corrosion prevention comprised plating a zinc sulfate bath having a zinc concentration of 5 g/L and a sulfuric acid concentration of 50 g/L at a current density of 5 A/dm$^2$ for 8 seconds, followed by immersion in a bath of 10 g/L anhydrous chronic acid for 10 seconds, washing with flowing water for 10 seconds, and drying with hot air.

The resulting electrolytic copper foil having the copper electrodeposit formed on the glossy surface side thereof was bonded under pressure on the glossy surface side thereof to one side of a substrate of glass-reinforced epoxy resin FR-4, thereby obtaining a copper-clad laminate.

Thereafter, a dry film (produced by Nichigou Alpha Co., Ltd.) was laminated to the copper-clad laminate, and a pattern was formed by UV exposure through a pattern film with a resist width of 50 μm and a pattern interval of 70 μm. Etching was performed at an etching solution temperature of 50° C. fo 50 seconds, using a commercially available etching solution of copper chloride.

Figure 1:
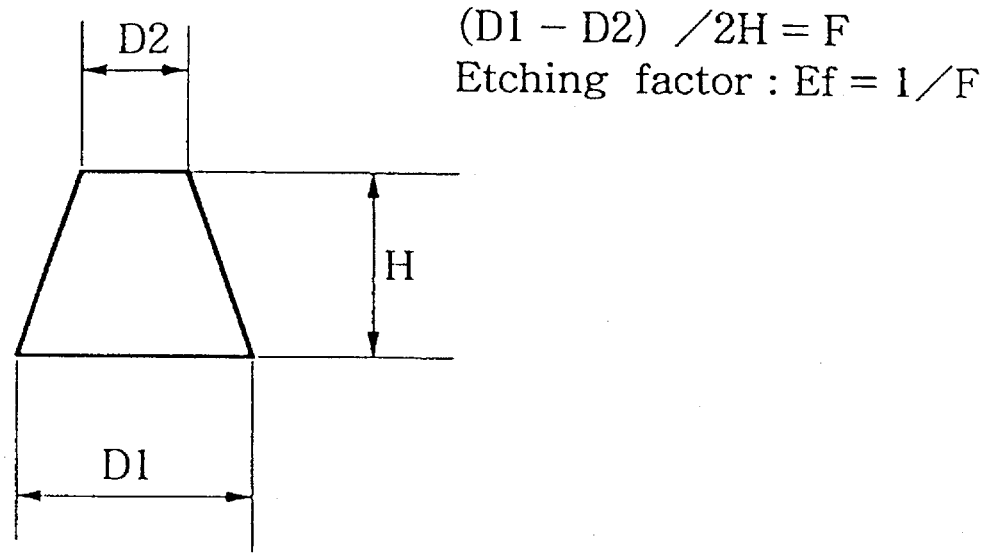
FIG. 1 is an explanatory view of the etching factor for a wiring pattern.
Figure 2A:
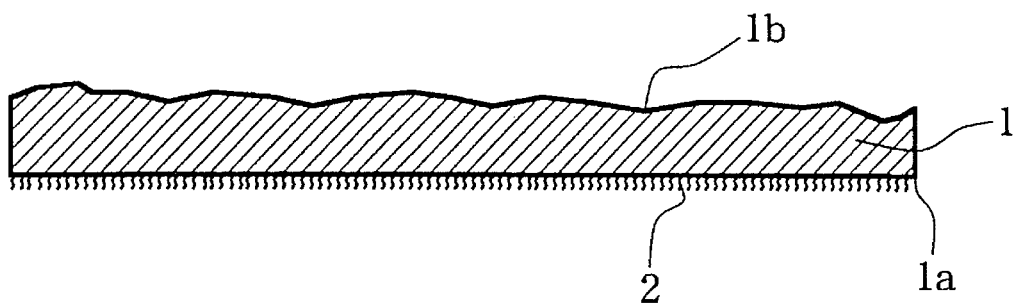
FIGS. 2(*a*), 2(*b*), 2(*c*) illustrates the steps for producing a copper-clad laminate according to the present invention.
Figure 2B:
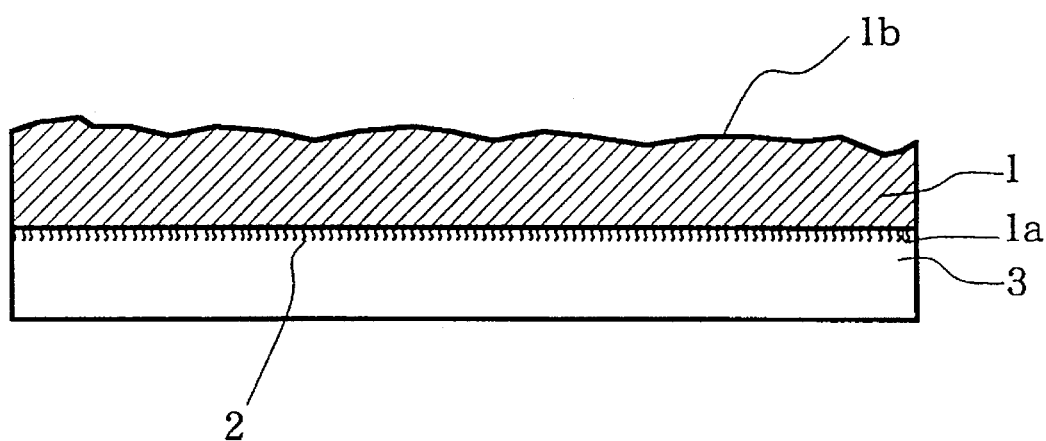
Figure 2C:
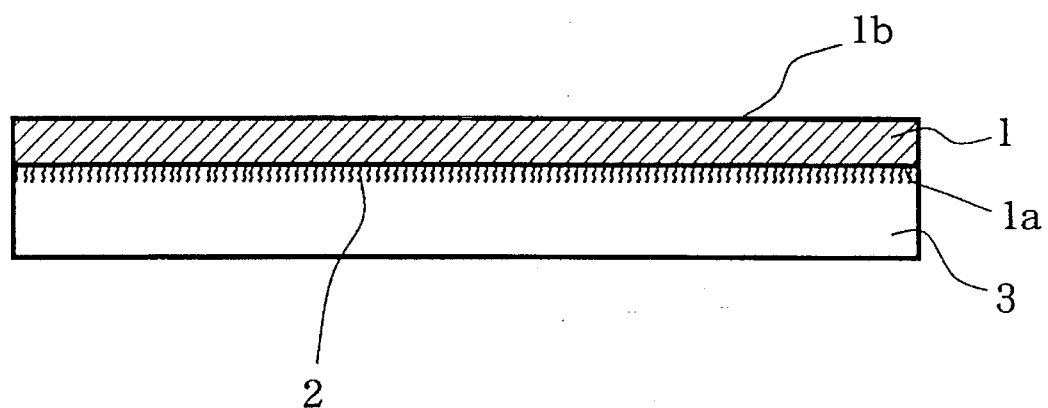
Figure 3:
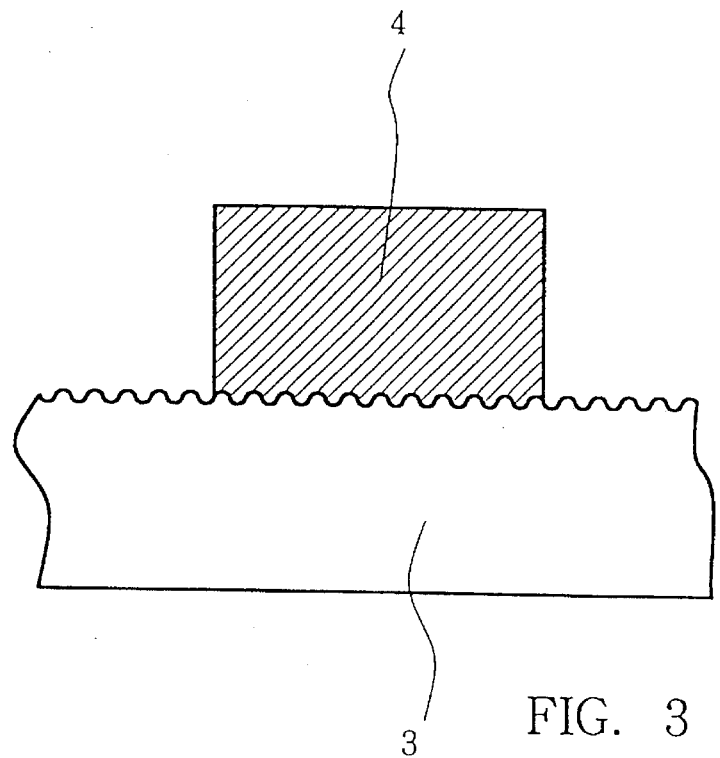
FIG. 3 is a sectional view of a fine-pitch wiring pattern obtained in Example 1.

A wiring pattern sectional view of the obtained printed wiring board is schematically shown in FIG. 3. In the figure, numeral 3 designates a substrate and numeral 4 designates a fine-pitch wiring (circuit) pattern. In the wiring pattern the top side is 42.2 μm the bottom side is 49.2 μm and the height is 31.7 μm. Thus, the etching factor is 9.0. There were no copper particles at the bottom of the etching pattern on the substrate of the glass-reinforced epoxy resin. The pool strength after the etching was 1.55 kg/cm.

EXAMPLE 2

A granular copper layer was formed by plating on a glossy surface side of an electrolytic copper foil of 35 μm in thickness having a surface roughness (Rz) of 1.3 μm on the glossy surface and a surface roughness (Rz) of 5.4 μm on the matte surface. As a result, roughness is (Rz) of the glossy surface side of the copper foil became 2.9 μm. The plating for electrodepositing the granular copper layer was conducted under the same conditions as in Example 1.

The resultant electrolytic copper foil was subjected on both sides to the treatment for corrosion prevention under the same conditions as in Example 1.

The obtained electrolytic copper foil having the copper electrodeposit formed on the glossy surface side thereof was bonded under pressure, on the glossy surface side thereof, to one side of a substrate of glass-reinforced epoxy resin FR-4 in the same manner as in Example 1, thereby obtaining a copper-clad laminate.

Although the matte side roughness was not excessive, the matte surface side of the copper foil of the copper-clad laminate was buffed to improve resist definition with #600 buff (manufactured by Taunoda Brush Co., Ltd.) under the condition such that the revolution speed was 500 rpm, the applied pressure was 0.5 kg and the line speed was 3 m/min.

Thereafter, in the same manner as in Example 1 a pattern was formed by UV exposure through a pattern film with a resist width of 50 μm and a pattern interval of 70 μm followed by etching thereby obtaining a printed wiring board.

A wiring pattern of the obtained printed wiring board had a top side of 41.7 μm a bottom side of 49.2 μm and a height of 30.8 μm. Thus, the etching factor was 8.4. There were no copper particles at the bottom of the etching pattern on the substrate of the glass-reinforced epoxy resin. The peel strength after the etching was 1.49 kg/cm.

COMPARATIVE EXAMPLE 1

Using the same electrolytic copper foil as in Example 1, a granular copper layer was electrodeposited by plating on the matte surface side of the electrolytic copper foil. As a result, the roughness (Rz) of the matte surface side of the copper foil became 4.2 μm. The plating for electrodepositing the granular copper layer was conducted under the same conditions as in Example 1.

The resulting electrolytic copper foil having the copper electrodeposit formed on the matte surface side thereof was bonded under pressure, on the matte surface side thereof, to one side of a substrate of glass-reinforced epoxy resin FR-4 in the same manner as in Example 1, thereby obtaining a copper-clad laminate.

Thereafter, in the same manner as in Example 1, a pattern was formed by UV exposure through a pattern film with a resist width of 50 μm and a pattern interval of 70 μm, followed by etching, thereby obtaining a printed wiring board.

A wiring pattern of the obtained printed wiring board had a top side of 40.3 μm, a bottom side of 56.3 μm and a height of 32.0 μm. Thus, the etching factor was 4.0. The peel strength after the etching was 1.71 kg/cm.

COMPARATIVE EXAMPLE 2

Using the same electrolytic copper foil as in Example 2 a granular copper layer was electrodeposited by plating on the matte surface side of the electrolytic copper foil. As a result, the roughness (Rz) of the matte surface side of the copper foil became 6.7 μm. The plating for electrodepositing the granular copper layer was conducted under the same conditions as in Example 1.

The resulting electrolytic copper foil having the copper electrodeposit formed on the matte surface side thereof was bonded under pressure, on the matte surface side thereof, to one side of a substrate of glass-reinforced epoxy resin FR-4 in the same manner as in Example 1, thereby obtaining a copper-clad laminate.

Thereafter, in the same manner as in Example 1, a pattern was formed by UV exposure through a pattern film with a resist width of 50 μm and a pattern interval of 70 μm, followed by etching, thereby obtaining a printed wiring board.

Figure 4:
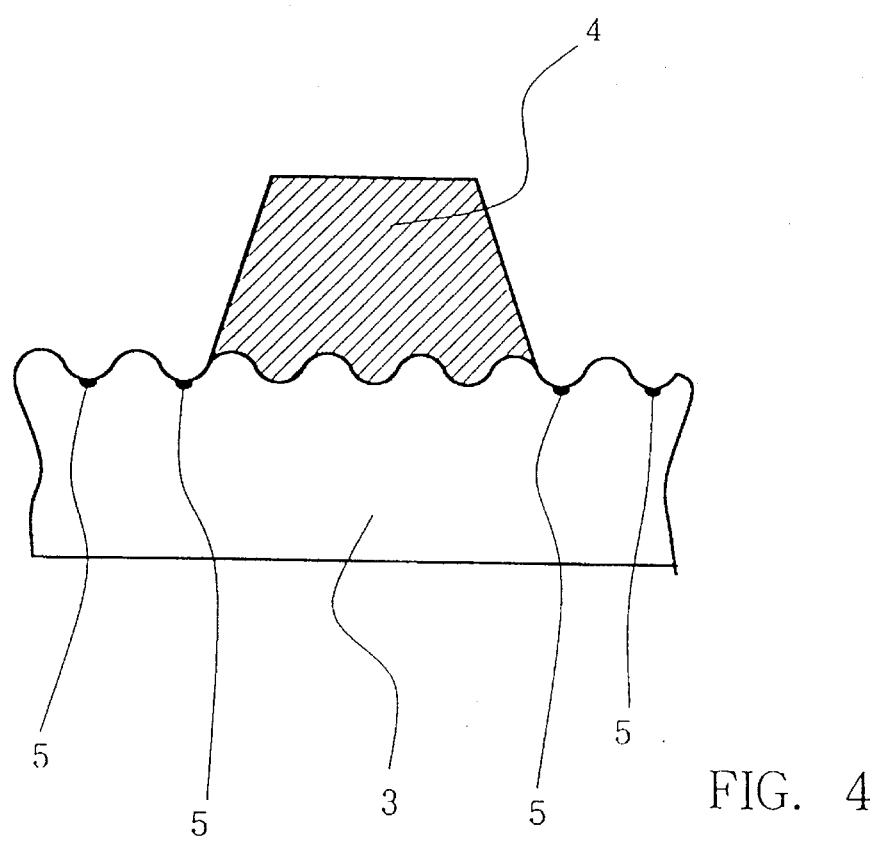
FIG. 4 is a sectional view of a fine-pitch wiring pattern obtained in Comparative Example 2.

A wiring pattern sectional view of the obtained printed wiring board is schematically shown in FIG. 4. In the wiring pattern, the top side is 37.2 μm, the bottom side is 66.3 μm and the height is 35.0 μm. Thus, the etching factor is 2.4. There was an adhesion and remaining of copper particles, as indicated by numeral 5 at the base of the etching pattern of the substrate of the glass-reinforced epoxy resin. The peel strength after the etching was 2.18 kg/cm.

From the above examples it can be seen that much more accurate etching was achieved when the glossy side of the foil was laminated to the substrate. In each case, the roughness of the matte surface was relatively low so that the resist could be applied. At the same time, the grain size was within the desired limits as indirectly defined by the matte side surface roughness, within the range of about 2.0 to 7.5 μm.

Greater roughness would cause problems with printing and removal of the resist and would involve an undesirable copper grain size in the foil which is detrimental to accurate etching of the circuit patterns.

What is claimed is:

1. In a copper clad laminate which consists essentially of an electrolytic copper foil (1) and a substrate (3), said substrate (3) having two sides, said electrolytic copper foil (1) having a glossy surface side (1a) and a matte surface side (1b), a granular copper layer (2) being electrodeposited on said glossy surface side (1a), said glossy surface side (ia) being bonded through said granular copper layer (2) to at least one side of said substrate (3), the improvement comprising using an electrolytic copper foil (1) having a matte surface roughness Rz as made of about 2.0 to 7.5 μm.

2. The laminate of claim 1 wherein said electrolytic copper foil (1) provides an etching factor of at least 4.

3. A printed wiring board prepared by etching said copper clad laminate according to claim 1 in the direction from said matte surface towards said glossy surface.

4. The printed wiring board according to claim 3 which is produced by applying a resist to said matte surface and said printed wiring board has a fine pitch wiring pattern of up to 150 μm.

* * * * *